(12) United States Patent
Jin et al.

(10) Patent No.: US 8,519,495 B2
(45) Date of Patent: Aug. 27, 2013

(54) SINGLE LINE MRAM

(75) Inventors: Insik Jin, Eagan, MN (US); Hongyue Liu, Maple Grove, MN (US); Yong Lu, Rosemount, MN (US); Xiaobin Wang, Chanhassen, MN (US)

(73) Assignee: Seagate Technology LLC, Cupertino, CA (US)

( * ) Notice: Subject to any disclaimer, the term of this patent is extended or adjusted under 35 U.S.C. 154(b) by 486 days.

(21) Appl. No.: 12/372,025

(22) Filed: Feb. 17, 2009

(65) Prior Publication Data

US 2010/0207219 A1    Aug. 19, 2010

(51) Int. Cl.
H01L 29/82 (2006.01)

(52) U.S. Cl.
USPC .................................. 257/421; 257/E43.001

(58) Field of Classification Search
USPC ........................................ 257/421, E43.001
See application file for complete search history.

(56) References Cited

U.S. PATENT DOCUMENTS

| | | | |
|---|---|---|---|
| 6,291,993 B1 * | 9/2001 | Fert et al. | ....................... 324/252 |
| 6,385,082 B1 | 5/2002 | Abraham | |
| 6,891,193 B1 | 5/2005 | Schwarz | |
| 6,903,964 B2 | 6/2005 | Nahas | |
| 7,095,646 B2 | 8/2006 | Slaughter | |
| 7,098,494 B2 * | 8/2006 | Pakala et al. | ................... 257/295 |
| 7,187,577 B1 | 3/2007 | Wang | |
| 7,224,601 B2 | 5/2007 | Panchula | |
| 7,272,034 B1 | 9/2007 | Chen | |
| 7,272,035 B1 | 9/2007 | Chen | |
| 7,289,356 B2 | 10/2007 | Diao | |
| 7,329,935 B2 | 2/2008 | Rizzo | |
| 7,345,912 B2 | 3/2008 | Luo | |
| 7,379,327 B2 | 5/2008 | Chen | |
| 7,390,584 B2 * | 6/2008 | Daughton et al. | ......... 428/811.2 |
| 7,502,249 B1 | 3/2009 | Ding | |
| 7,515,457 B2 | 4/2009 | Chen | |
| 2004/0164369 A1 * | 8/2004 | Chen | .............................. 257/421 |
| 2005/0002267 A1 * | 1/2005 | Daughton et al. | ............. 365/232 |
| 2007/0007608 A1 * | 1/2007 | Chen | .............................. 257/421 |
| 2008/0273380 A1 | 11/2008 | Diao | |
| 2008/0310213 A1 | 12/2008 | Chen | |
| 2008/0310219 A1 | 12/2008 | Chen | |
| 2009/0040855 A1 | 2/2009 | Luo | |
| 2009/0185410 A1 | 7/2009 | Huai | |
| 2009/0219754 A1 * | 9/2009 | Fukumoto | ..................... 365/158 |
| 2009/0224300 A1 * | 9/2009 | Yamagishi et al. | ........... 257/295 |
| 2009/0256220 A1 * | 10/2009 | Horng et al. | .................. 257/421 |
| 2010/0065935 A1 * | 3/2010 | Horng et al. | .................. 257/421 |
| 2010/0096716 A1 * | 4/2010 | Ranjan et al. | ................. 257/421 |
| 2010/0140726 A1 * | 6/2010 | Apalkov et al. | ............... 257/421 |

* cited by examiner

*Primary Examiner* — Allan R Wilson
(74) *Attorney, Agent, or Firm* — Mueting Raasch & Gebhardt PA

(57) ABSTRACT

A magnetic memory device includes a first electrode separated from a second electrode by a magnetic tunnel junction. The first electrode provides a write current path along a length of the first electrode. The magnetic tunnel junction includes a free magnetic layer having a magnetization orientation that is switchable between a high resistance state magnetization orientation and a low resistance state magnetization orientation. The free magnetic layer is spaced from the first electrode a distance of less than 10 nanometers. A current passing along the write current path generates a magnetic field. The magnetic field switches the free magnetic layer magnetization orientation between a high resistance state magnetization orientation and a low resistance state magnetization orientation.

19 Claims, 7 Drawing Sheets

SINGLE LINE MRAM

BACKGROUND

Fast growth of the pervasive computing and handheld/communication industry has generated exploding demand for high capacity nonvolatile solid-state data storage devices. Flash memory is one such device but has several drawbacks such as slow access speed, limited endurance, and the integration difficulty in system-on-chip (SoC). Flash memory (NAND or NOR) also faces significant scaling problems.

Magneto-resistive or magnetic Random Access Memory (MRAM) is a candidate for future nonvolatile and universal memory. MRAM features non-volatility, fast writing/reading speed (<10 ns), almost unlimited programming endurance ($>10^{15}$ cycles) and zero standby power. One basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ. In operation, the MRAM can be read by measuring the tunneling resistance and inferring the magnetization state of the MTJ.

As the MTJ size shrinks, the switching magnetic field amplitude increases and the switching variation becomes more severe. Hence, the incurred high power consumption limits the scaling of conventional MRAM. Thus, there is a need for MRAM that can operate at lower power.

BRIEF SUMMARY

The present disclosure relates to single line MRAM. In particular, the present disclosure relates to MRAM that can be switched between a high and low resistance data state using a single line of current.

In one particular embodiment, a magnetic memory device includes a first electrode separated from a second electrode by a magnetic tunnel junction. The first electrode provides a write current path along a length of the first electrode. The magnetic tunnel junction includes a free magnetic layer having a magnetization orientation that is switchable between a high resistance state magnetization orientation and a low resistance state magnetization orientation. The free magnetic layer is spaced from the first electrode a distance of less than 10 nanometers. A current passing along the write current path generates a magnetic field. The magnetic field switches the free magnetic layer magnetization orientation between a high resistance state magnetization orientation and a low resistance state magnetization orientation.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to single line MRAM. In particular, the present disclosure relates to MRAM that can be switched between a high and low resistance data state using a single line of current. The single line of current can be one of the electrodes sandwiching a magnetic tunnel junction. The single line of current is separated from a free magnetic layer of the magnetic tunnel junction by a distance of 10 nanometers or less. Thus, the single line of current applies a large magnetic field on the free magnetic layer, even with a small current. In many embodiments, the geometrical line of the free magnetic layer is tilted from the perpendicular line of the single line of current, allowing for easier switching of the free magnetic layer. Separate current path for reading and writing of the magnetic tunnel junction are also described. While the present disclosure is not so limited, an appreciation of various aspects of the disclosure will be gained through a discussion of the examples provided below.

Figure 1:
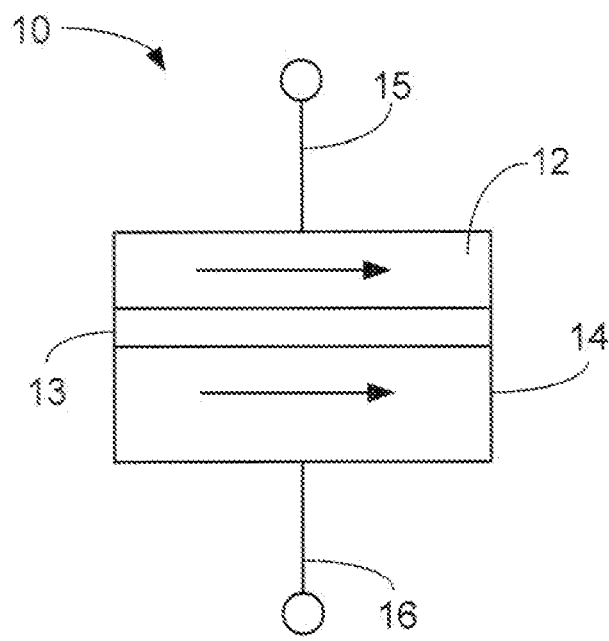
FIG. 1 is a cross-sectional schematic diagram of an illustrative magnetic memory MTJ memory unit in the low resistance state.
Figure 2:
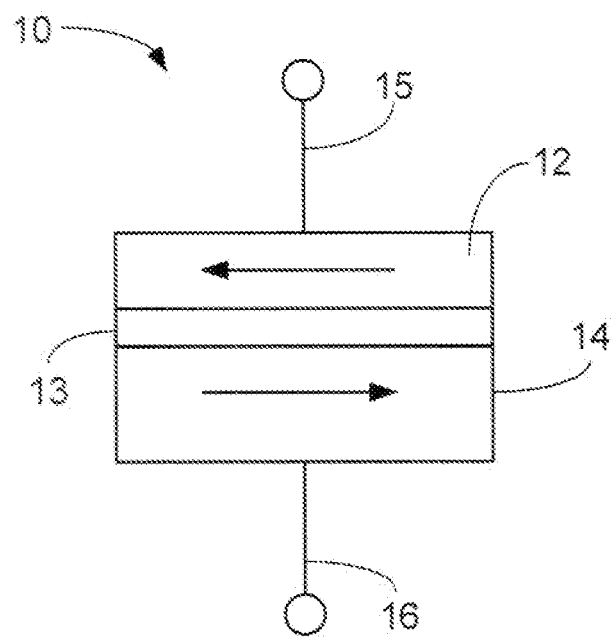
FIG. 2 is a cross-sectional schematic diagram of another magnetic memory MTJ memory unit in the high resistance state

FIG. 1 is a cross-sectional schematic diagram of an illustrative magnetic memory MTJ memory unit 10 in the low resistance state and FIG. 2 is a cross-sectional schematic diagram of another magnetic memory MTJ memory unit 10 in the high resistance state. A magnetic tunnel junction (MTJ) memory unit 10 includes a magnetic (e.g., ferromagnetic) free layer 12 and a magnetic (e.g., ferromagnetic) reference (i.e., pinned) layer 14.

In many embodiments, the magnetic memory MTJ memory unit 10 operates as a tunneling junction device where the magnetic free layer 12 and a magnetic reference layer 14 are separated by an oxide barrier layer 13. The insulating barrier layer 13 may be made of an electrically insulating material such as, for example an oxide material (e.g., $Al_2O_3$ or MgO). The insulating barrier layer 13 can be termed a tunnel barrier. Other suitable materials may also be used.

In other embodiments, the magnetic memory MTJ memory unit 10 operates as a spin valve where the magnetic free layer 12 and a magnetic reference layer 14 are separated by a non-magnetic conductive layer 13 spacer layer. The spacer layer 13 may be made of an electrically conducting non-magnetic material such as, for example Cu or Ru. The spacer layer 13 can be termed a tunnel barrier. Other suitable materials may also be used.

A first electrode 15 is in electrical contact with the magnetic free layer 12 and a second electrode 16 is in electrical contact with the magnetic reference layer 14. The magnetic layers 12, 14 may be made of any useful ferromagnetic (FM) alloys such as, for example, Fe, Co, Ni. Other suitable materials may also be used.

The electrodes 15, 16 electrically connect the magnetic layers 12, 14 to a control circuit providing read and write currents through the magnetic layers 12, 14. The resistance across the magnetic memory MTJ memory unit 10 is determined by the relative orientation of the magnetization vectors or magnetization orientations of the magnetic layers 12, 14. The magnetization direction of the magnetic reference layer 14 is pinned in a predetermined direction while the magnetization direction of the magnetic free layer 12 is free to rotate under the influence of a magnetic field. Pinning of the magnetic reference layer 14 may be achieved through, e.g., the use of exchange bias with an antiferromagnetically ordered material such as PtMn, IrMn and others.

FIG. 1 illustrates the magnetic memory MTJ memory unit 10 in the low resistance state where the magnetization orientation of the magnetic free layer 12 is parallel and in the same direction of the magnetization orientation of the magnetic reference layer 14. This is termed the low resistance state or "0" data state. FIG. 2 illustrates the magnetic memory MTJ memory unit 10 in the high resistance state where the magnetization orientation of the magnetic free layer 12 is anti-parallel and in the opposite direction of the magnetization orientation of the magnetic reference layer 14. This is termed the high resistance state or "1" data state.

Switching the resistance state and hence the data state of the MTJ memory unit 10 via magnetic field occurs when a current passing adjacent to the magnetic free layer 12 generates a magnetic field that rotates the magnetization orientation of the magnetic free layer 12 of the MTJ 10. When a sufficient magnetic field is applied to the free layer 12, the magnetization orientation of the free layer 12 can be switched between two opposite directions and accordingly the MTJ 10 can be switched between the parallel state (i.e., low resistance state or "0" data state) and anti-parallel state (i.e., high resistance state or "1" data state) depending on the direction of the magnetic field.

The illustrative magnetic memory MTJ memory unit 10 may be used to construct a memory device that includes multiple MTJ memory units where a data bit is stored in magnetic memory MTJ memory unit by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the magnetic memory MTJ memory unit 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Generally, the anisotropy causes a soft and hard axis to form in thin magnetic layers. The hard and soft axes are defined by the magnitude of the energy, usually in the form of a magnetic field, needed to fully rotate (saturate) the direction of the magnetization in that direction, with the hard axis requiring a higher saturation magnetic field.

Figure 3:
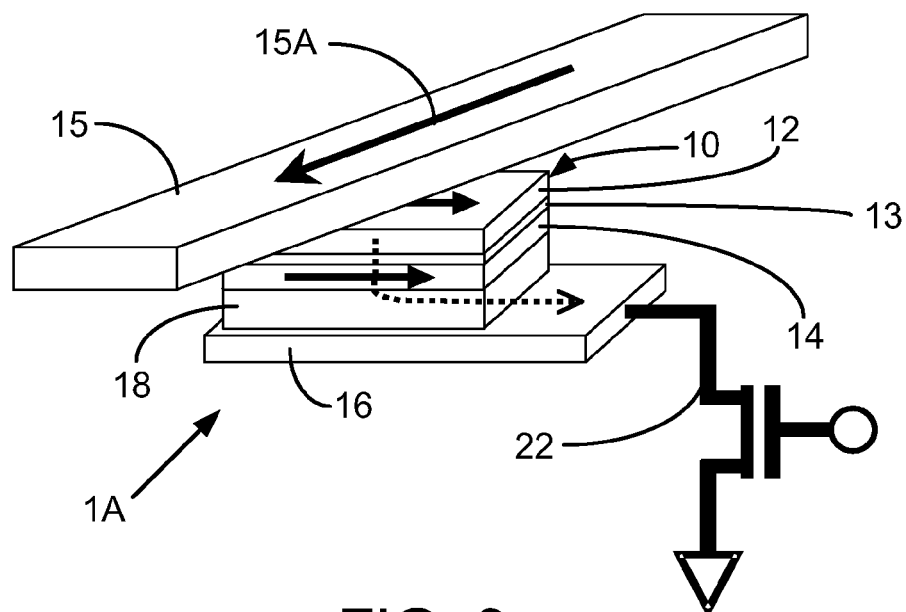
FIG. 3 is a schematic perspective view of one embodiment of a magnetic memory unit having a magnetic tunnel junction cell with an adjacent magnetic field generating current path.

FIG. 3 is a schematic perspective view of one embodiment of a magnetic memory unit 1A having a magnetic tunnel junction cell 10 with an adjacent magnetic field current path 15. Memory unit 1A includes magnetic tunnel junction cell 10. Magnetic tunnel junction cell 10 has a magnetic (e.g., ferromagnetic) free layer 12, a nonmagnetic tunnel barrier 13, a magnetic (e.g., ferromagnetic) pinned (i.e., reference) layer 14, and an antiferromagnetic pinning layer 18, arranged with tunnel barrier 13 positioned between free layer 12 and pinned layer 18, and pinning layer 18 proximate pinned layer 14 opposite tunnel barrier 13. In the illustrated orientation, free layer 12 is the top layer of the stack of layers. Tunnel barrier 13 spatially separates free layer 12 from pinned layer 14. Proximate pinning layer 18 is an electrode 16 that electrically connects magnetic tunnel junction cell 10 to control transistor 22.

The ferromagnetic layers for the structure, e.g., free layer 12 and pinned layer 14, can be, but not be limited to, transition metals such as Ni, Co, Fe and their alloys such as NiFe and CoFe, as described above. Ternary alloys, such as CoFeB, may be particularly useful. Either or both of free layer 12 and pinned layer 14 may be either a single layer or an unbalanced synthetic antiferromagnetic (SAF) coupled structure, i.e., two ferromagnetic sublayers separated by a metallic spacer, such as Ru or Cu, with the magnetization orientations of the sublayers in opposite directions to provide a net magnetization.

Tunnel barrier layer 13 may be a nonmagnetic metallic material or a nonmagnetic metal oxide material; examples of suitable conductive metallic materials include Cu, Ag, and Au, and examples of insulating oxide and semiconductor barriers include AlO, $Al_2O_3$, TiO, and MgO. Tunneling barrier layer 13 could optionally be patterned with free layer 12 or with pinned layer 14, depending on process feasibility and device reliability.

Each of free layer 12 and pinned layer 14 has a magnetic orientation or magnetization orientation associated there-with. Pinned layer 14 is pinned by antiferromagnetic pinning layer 18, or in other embodiments, may be a fixed layer without pinning but with a high coercivity to stabilize itself.

In FIG. 3, the magnetization orientation of free layer 12, is illustrated parallel to the magnetization orientation of pinned layer 14. A read operation passes a current through magnetic tunnel junction cell 10 in the direction from the free layer 12 to pinned layer 14 or vice versa (illustrated by the dashed line). The read operation current path can be orthogonal to the write operation current path 15A. The write operation current path 15A forms an angle with the magnetization orientation of free layer 12, as described in relation to FIGS. 7A to 7C and FIGS. 8A to 8C. The write current path 15A defines a first horizontal plane (generally illustrated by an upper planar surface of electrode element 15) and the free layer 12 magnetization orientation (illustrated as the arrow on the free layer 12) defines a second horizontal plane (generally illustrated by an upper planar surface of the free layer 12), and the first horizontal plane is parallel to the second horizontal plane.

Positioned adjacent to the free magnetic layer 12 is a magnetic field generator current path 15 (i.e., first electrode 15). For memory unit 1A of FIG. 3, the magnetic field generator current path 15 is within a distance $D_1$ (see FIG. 4) being less than 15 nanometers, or less than 10 nanometers, or less than 5 nanometers from the free magnetic layer 12. Magnetic field generator current path 15 provides a magnetic field with current flow 15A in a direction that switches the free layer 12 magnetization orientation between a high resistance state and a low resistance state.

Figure 4:
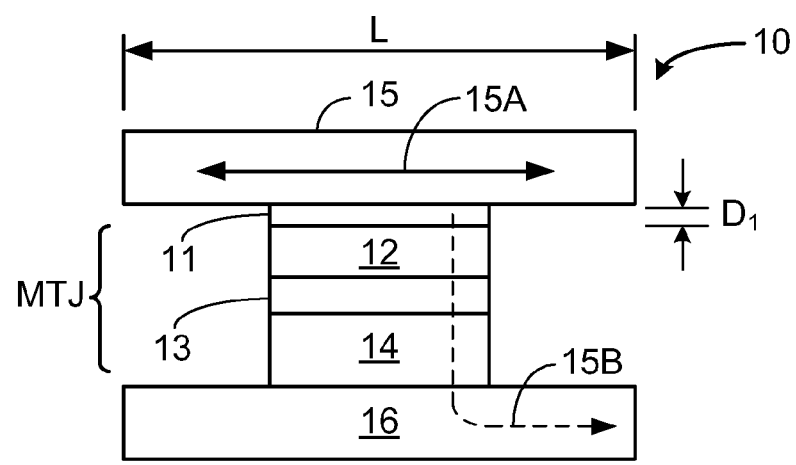
FIG. 4 is a schematic diagram cross-section of an illustrative magnetic memory unit.

FIG. 4 is a schematic diagram cross-section of an illustrative magnetic memory unit. The magnetic memory unit 10 includes a first electrode 15 separated from a second electrode 16 by a magnetic tunnel junction MTJ. The first electrode 15 provides a write current path 15A along a length L of the first electrode 15. The magnetic tunnel junction MTJ includes a free magnetic layer 12 having a magnetization orientation that is switchable between a high resistance state magnetization orientation and a low resistance state magnetization orientation. In some embodiments, a capping layer 11 separates the magnetic tunnel junction MTJ from the first electrode 15. The capping layer 11 can be formed of any useful material. In some embodiments, the capping layer 11 includes a non-magnetic, conductive material such as Ru, Ta, or TaN. In some embodiments, the capping layer 11 includes a magnetic, conductive material such as permalloy. A permalloy layer 11 can effectively reduce the distance between the free magnetic layer 12 and the first electrode 15 due to exchange coupling between the permalloy layer 11 and the free magnetic layer 12.

The free magnetic layer 12 is spaced from the first electrode 15 a distance of less than 15 nanometers or less than 10 nanometers or less than 5 nanometers. A current passing along the write current path 15A generates a magnetic field (see FIG. 7B and FIG. 8B). The magnetic field switches the free magnetic layer 12 magnetization orientation between a high resistance state magnetization orientation and a low resistance state magnetization orientation. For example, passing the current along the write current path 15A (e.g., length L) of the first electrode 15 in a first direction (from left to right for example) switches the free magnetic layer 12 magnetization orientation from a high resistance state magnetization orientation to a low resistance state magnetization orientation, and passing a current along the write current path 15A (e.g., length L) in an opposing second direction (from right to left, for example) switches the free magnetic layer 12 magnetization orientation from a low resistance state magnetization orientation to a high resistance state magnetization orientation.

A read operation passes a current through magnetic tunnel junction cell 10 in the direction from the free layer 12 to the pinned layer 14 or vice versa (illustrated by the dashed line 15B). The read operation current path 15B can be orthogonal to the write operation current path 15A. The write operation current path 15A forms an angle with the magnetization orientation of free layer 12, as described in relation to FIGS. 7A to 7C and FIGS. 8A to 8C.

Figure 5:
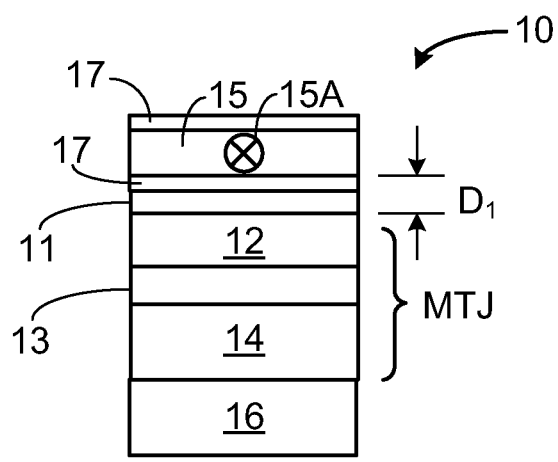
FIG. 5 is a schematic diagram cross-section of another illustrative magnetic memory unit including a first electrode with permalloy layers.

FIG. 5 is a schematic diagram cross-section of another illustrative magnetic memory unit 10 including a first electrode 15 with permalloy layers 17. The magnetic memory unit 10 includes a first electrode 15 separated from a second electrode 16 by a magnetic tunnel junction MTJ. The first electrode 15 provides a write current path 15A along a length of the first electrode 15. Here the length extends out of the page and thus, the current 15A is illustrated as directed into the page. The magnetic tunnel junction MTJ includes a free magnetic layer 12 having a magnetization orientation that is switchable between a high resistance state magnetization orientation and a low resistance state magnetization orientation. In some embodiments, a capping layer 11 separates the magnetic tunnel junction MTJ from the first electrode 15. The capping layer 11 can be formed of any useful material, as described above.

A layer of permalloy 17 is disposed on the first electrode 15 to improve the magnetic flux generated by the current passing along the length of the first electrode 15. In some embodiments, two layers of permalloy 17 sandwiches the first electrode 15, as illustrated. The permalloy layers 17 have any useful thickness. A permalloy layer 11 can effectively reduce the distance between the free magnetic layer 12 and the first electrode 15 due to exchange coupling between the permalloy layer 11 and the free magnetic layer 12. In many embodiments, the permalloy layers 17 have a thickness in a from 0.5 to 5 nanometers.

The magnetic tunnel junction MTJ has a magnetic (e.g., ferromagnetic) free layer 12, a nonmagnetic tunnel barrier 13, and a magnetic (e.g., ferromagnetic) pinned (i.e., reference) layer 14, arranged with tunnel barrier 13 positioned between free layer 12 and pinned layer 18. Tunnel barrier 13 spatially separates free layer 12 from pinned layer 14.

The free magnetic layer 12 is spaced from the first electrode 15 a distance of less than 15 nanometers or less than 10 nanometers or less than 5 nanometers. A current passing along the write current path 15A generates a magnetic field (see FIG. 7B and FIG. 8B). The magnetic field switches the free magnetic layer 12 magnetization orientation between a high resistance state magnetization orientation and a low resistance state magnetization orientation.

Figure 6:
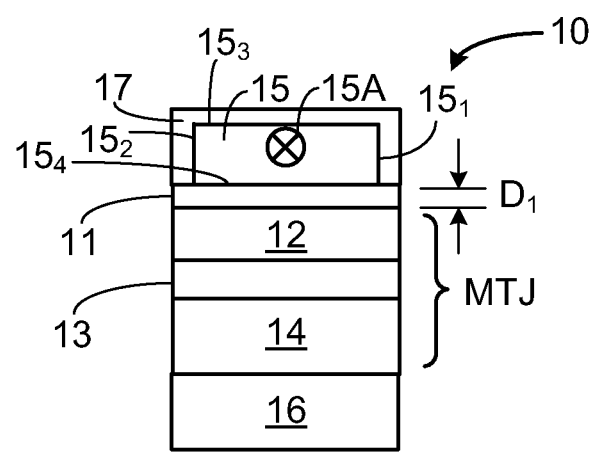
FIG. 6 is a schematic diagram cross-section of another illustrative magnetic memory unit including a first electrode with permalloy layers.

FIG. 6 is a schematic diagram cross-section of another illustrative magnetic memory unit 10 including a first electrode 15 with permalloy 17 disposed on three sides of the first electrode 15. The magnetic memory unit 10 includes a first electrode 15 separated from a second electrode 16 by a magnetic tunnel junction MTJ. The first electrode 15 provides a write current path 15A along a length of the first electrode 15. Here the length extends out of the page and thus, the current 15A is illustrated as directed into the page. The magnetic tunnel junction MTJ includes a free magnetic layer 12 having a magnetization orientation that is switchable between a high resistance state magnetization orientation and a low resistance state magnetization orientation. In some embodiments, a capping layer 11 separates the magnetic tunnel junction MTJ from the first electrode 15. The capping layer 11 can be formed of any useful material, as described above.

A layer of permalloy 17 is disposed on three sides of the first electrode 15 to improve the magnetic flux generated by the current passing along the length of the first electrode 15. The first electrode 15 is defined by opposing first and second surfaces $15_1$ and $15_2$ and opposing third and fourth surfaces $15_3$ and $15_4$. The third and fourth surfaces $15_3$ and $15_4$ are orthogonal to the first and second surfaces $15_1$ and $15_2$. The permalloy 17 is disposed on at least three of the first, second, third and fourth surfaces $15_1, 15_2, 15_3$ and $15_4$. In some embodiments, the permalloy 17 is disposed on all four of the first, second, third and fourth surfaces $15_1, 15_2, 15_3$ and $15_4$. The permalloy 17 has any useful thickness. In many embodiments, the permalloy 17 has a thickness in a from 0.5 to 5 nanometers.

The magnetic tunnel junction MTJ has a magnetic (e.g., ferromagnetic) free layer 12, a nonmagnetic tunnel barrier 13, and a magnetic (e.g., ferromagnetic) pinned (i.e., reference) layer 14, arranged with tunnel barrier 13 positioned between free layer 12 and pinned layer 18. Tunnel barrier 13 spatially separates free layer 12 from pinned layer 14.

The free magnetic layer 12 is spaced from the first electrode 15 a distance of less than 15 nanometers or less than 10 nanometers or less than 5 nanometers. A current passing along the write current path 15A generates a magnetic field (see FIG. 7B and FIG. 8B). The magnetic field switches the free magnetic layer 12 magnetization orientation between a high resistance state magnetization orientation and a low resistance state magnetization orientation.

Figure 7A:
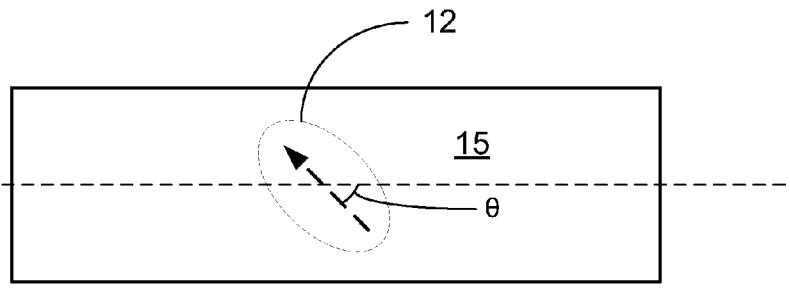
FIG. 7A to 7C are schematic diagram top views of a first electrode switching the free magnetic layer of the magnetic memory unit from a first data state to a second data state.
Figure 7B:
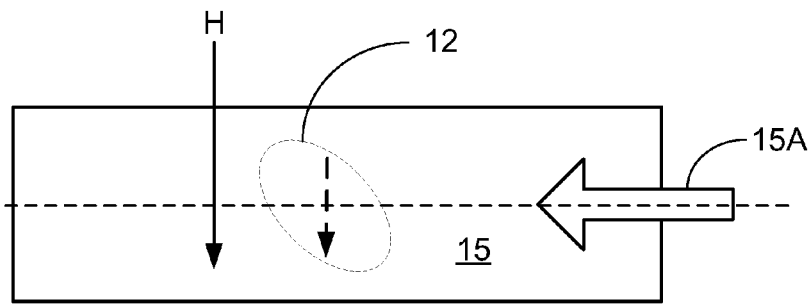
Figure 7C:
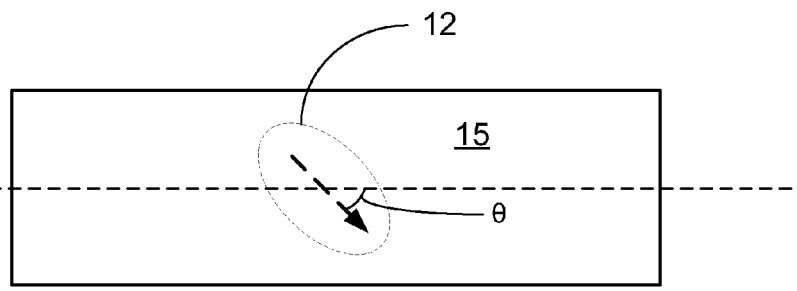
Figure 8A:
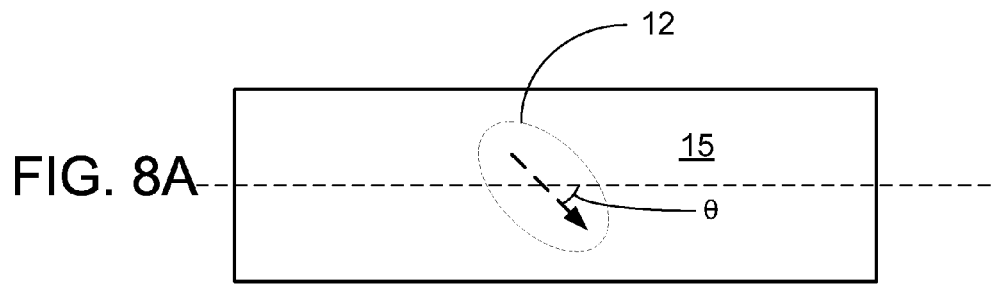
FIG. 8A to 8C are schematic diagram top views of a first electrode switching the free magnetic layer of the magnetic memory unit from a second data state to a first data state.
Figure 8B:
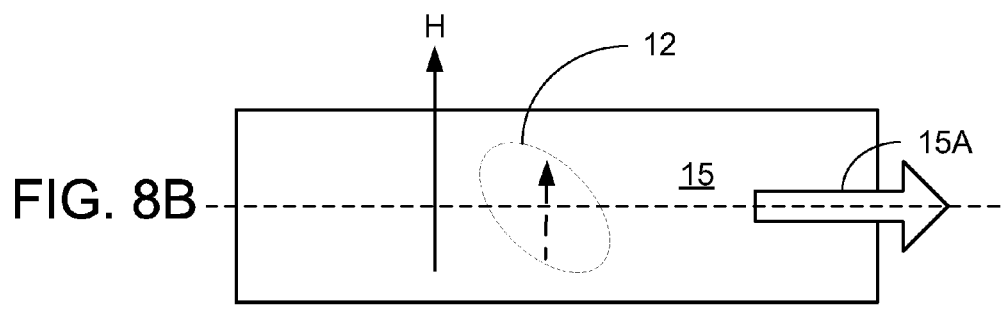
Figure 8C:
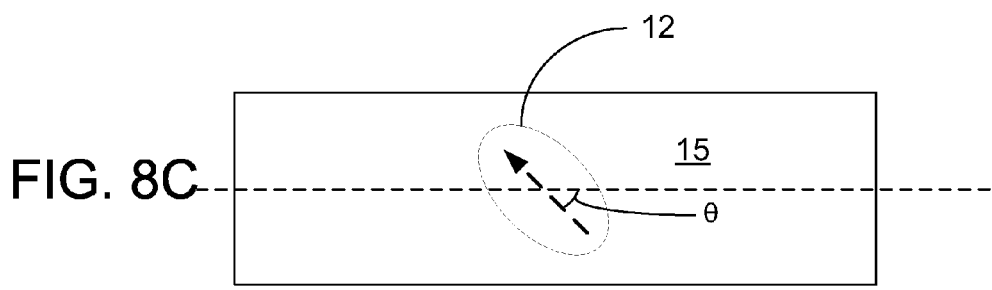

FIG. 7A to 7C are schematic diagram top views of a first electrode 15 switching the free magnetic layer 12 of the magnetic memory unit from a first data state (FIG. 7A) to a second data state (FIG. 7C) and FIG. 8A to 8C are schematic diagram top views of a first electrode 15 switching the free magnetic layer 12 of the magnetic memory unit from a second data state (FIG. 8A) to a first data state (FIG. 8C). The magnetization orientation of the free layer is illustrated as a dashed arrow and the perimeter of the free magnetic layer 12 is illustrated as a dashed line perimeter, since this element is covered by the first electrode 15. The current path is illustrated as a linear dashed line along the length of the first electrode 15.

In FIG. 7A the magnetization orientation of the free magnetic layer 12 forms an angle θ with the current path. The angle θ can be in a range from 10 to 80 degrees, or from 15 to 45 degrees. In FIG. 7B a current passes along the current path 15A in a first direction (from right to left, for example) forming a magnetic field H. The magnetic field H rotates the magnetization orientation of the free magnetic layer 12 as illustrated and switches the magnetization orientation of the free magnetic layer 12 from the first resistance data state (FIG. 7A) to the second resistance data state (FIG. 7C).

To switch the magnetization orientation of the free magnetic layer 12 from the second resistance data state (FIG. 8A) to the first resistance data state (FIG. 8C) the current passes along the current path 15A in a second direction (from left to right, for example) forming a magnetic field H. The magnetic field H rotates the magnetization orientation of the free magnetic layer 12 as illustrated and switches the magnetization orientation of the free magnetic layer 12 from the second resistance data state (FIG. 8A) to the first resistance data state (FIG. 8C). Thus, a single write current path 15A can rotate the magnetization orientation of the free magnetic layer 12 between the first resistance data state and the second resistance data state.

Figure 9:
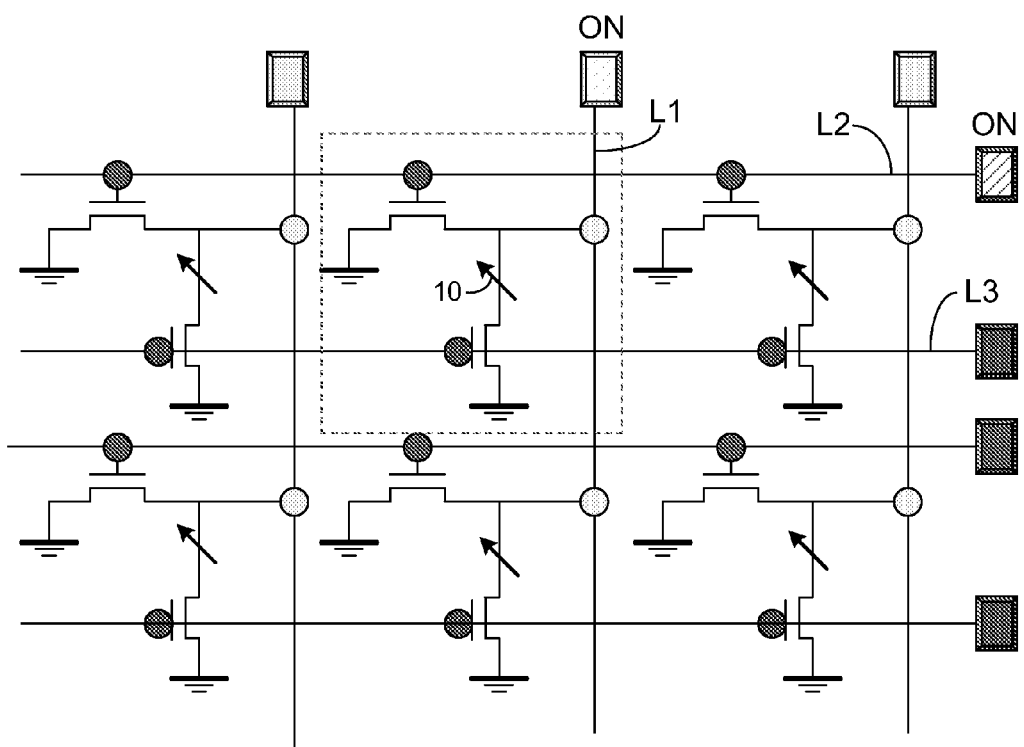
FIG. 9 is a schematic circuit diagram of writing to a magnetic memory unit in an illustrative magnetic memory array.
Figure 10:
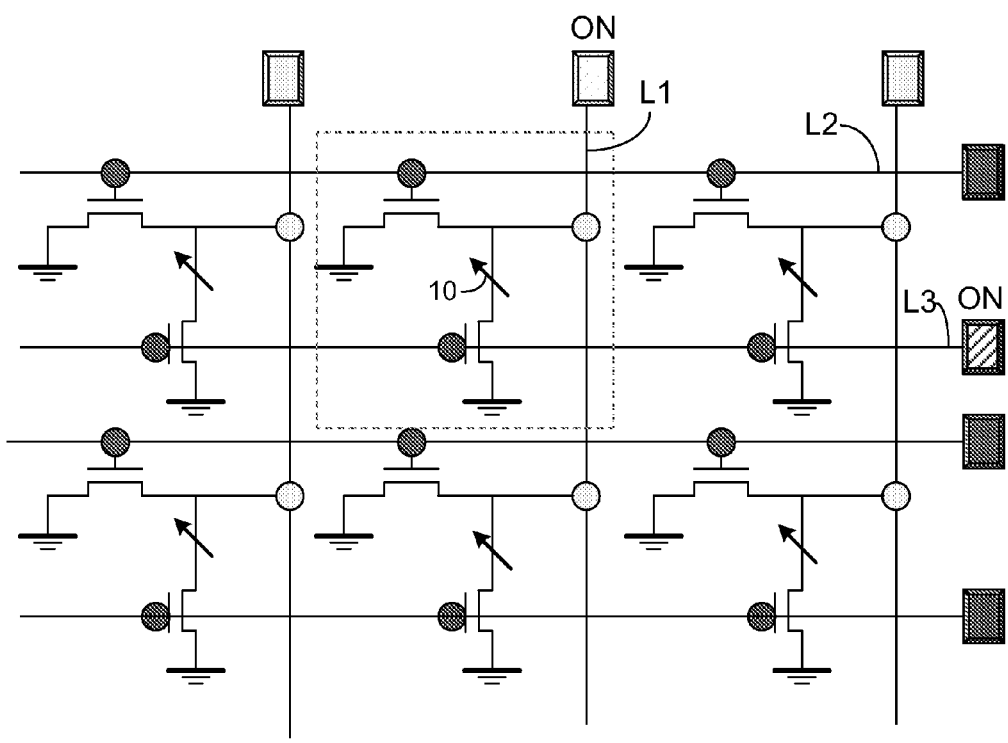
FIG. 10 is a schematic circuit diagram of reading a magnetic memory unit in an illustrative magnetic memory array.

FIG. 9 is a schematic circuit diagram of writing to a magnetic memory unit in an illustrative magnetic memory array, and FIG. 10 is a schematic circuit diagram of reading a magnetic memory unit in an illustrative magnetic memory array. A selected magnetic memory unit 10 for writing is illustrated within the dashed lines. The memory unit includes two transistors and five pads, as illustrated.

To write (FIG. 9) to the selected memory unit, two of the conductive lines L1 and L2 are activated to pass current along the current path of the first electrode generating a magnetic field and writing the free layer of the MTJ, as descried above. The conductive line L3 is not activated during writing so that current does not pass through the MTJ.

To read (FIG. 10) the selected memory unit, two of the conductive lines L1 and L3 are activated to pass current through the MTJ, as descried above. The conductive line L2 is not activated during reading.

Thus, embodiments of the SINGLE LINE MRAM are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A magnetic memory device comprising:
    a first electrode electrically coupled to a write current source, the first electrode providing a write current path along a length of the first electrode, and passing a current along the write current path generates a magnetic field;
    a second electrode; and
    magnetic tunnel junction electrically coupled to and separating the first electrode from the second electrode and the magnetic tunnel junction comprises a free magnetic layer having a magnetization orientation that is switchable between a high resistance state magnetization orientation and a low resistance state magnetization orientation, the free magnetic layer is spaced from the first electrode a distance of less than 10 nanometers, and the magnetic field switches the free magnetic layer magnetization orientation between a high resistance state magnetization orientation and a low resistance state magnetization orientation; and
    a permalloy layer separates the first electrode from the free magnetic layer;
    wherein the magnetic memory device generates the magnetic field solely by the write current passing along the first electrode.

2. A magnetic memory device according to claim 1, wherein the write current path defines a first horizontal plane and the free layer magnetization orientation defines a second horizontal plane, and the first horizontal plane is parallel to the second horizontal plane.

3. A magnetic memory device according to claim 1, wherein a read current path passes current from the first electrode, through the magnetic tunnel junction and to the second electrode, the read current path being orthogonal to the write current path.

4. A magnetic memory device according to claim 1, wherein the magnetic tunnel junction comprises the free magnetic layer separated from a reference layer by a non-magnetic, electrically insulating tunneling barrier.

5. A magnetic memory device according to claim 1, wherein the magnetic tunnel junction comprises the free magnetic layer separated from a reference layer by a non-magnetic, electrically conductive tunneling barrier.

6. A magnetic memory device according to claim 1, wherein passing a current along the write current path in a first direction switches the free magnetic layer magnetization orientation from a high resistance state magnetization orientation to a low resistance state magnetization orientation, and passing a current along the write current path in an opposing second direction switches the free magnetic layer magnetization orientation from a low resistance state magnetization orientation to a high resistance state magnetization orientation.

7. A magnetic memory device according to claim 1, wherein the first electrode comprises a layer of permalloy.

8. A magnetic memory device according to claim 1, wherein the high resistance state magnetization orientation and a low resistance state magnetization orientation forms an angle with the current path in a range from 10 to 80 degrees.

9. A magnetic memory device comprising:
a first electrode electrically coupled to a write current source, the first electrode providing a write current path along a length of the first electrode, and passing a current along the write current path generates a magnetic field, the first electrode comprising a layer of permalloy;
a second electrode; and
magnetic tunnel junction electrically coupled to and separating the first electrode from the second electrode and the magnetic tunnel junction comprises a free magnetic layer having a magnetization orientation that is switchable between a high resistance state magnetization orientation and a low resistance state magnetization orientation, and the magnetic field switches the free magnetic layer magnetization orientation between a high resistance state magnetization orientation and a low resistance state magnetization orientation; and
a permalloy layer separates the first electrode from the free magnetic layer;
wherein the magnetic memory device switches the free magnetic layer magnetization orientation between a high resistance state magnetization orientation and a low resistance state magnetization orientation with only a single write current and to generates the magnetic field solely by the write current passing along the first electrode.

10. A magnetic memory device according to claim 9, wherein the free magnetic layer is spaced from the first electrode a distance of less than 10 nanometers.

11. A magnetic memory device according to claim 9, wherein the high resistance state magnetization orientation and a low resistance state magnetization orientation forms an angle with the current path in a range from 10 to 80 degrees.

12. A magnetic memory device according to claim 9, wherein the first electrode is defined by opposing first and second surfaces and opposing third and fourth surfaces, the third and fourth surfaces are orthogonal to the first and second surfaces, and permalloy is disposed on two of the first, second, third and fourth surfaces.

13. A magnetic memory device according to claim 12, wherein the permalloy is disposed on three of the first, second, third and fourth surfaces.

14. A magnetic memory device according to claim 9, wherein the magnetic tunnel junction comprises the free magnetic layer separated from a reference layer by a non-magnetic, electrically insulating tunneling barrier.

15. A magnetic memory device according to claim 9, wherein the magnetic tunnel junction comprises the free magnetic layer separated from a reference layer by a non-magnetic, electrically conductive tunneling barrier.

16. A magnetic memory device according to claim 9, wherein the write current path defines a first horizontal plane and the free layer magnetization orientation defines a second horizontal plane, and the first horizontal plane is parallel to the second horizontal plane.

17. A magnetic memory device comprising:
a first electrode comprising a layer of permalloy and electrically coupled to a write current source, the first electrode providing a write current path along a length of the first electrode, and passing a current along the write current path generates a magnetic field;
a second electrode; and
magnetic tunnel junction electrically coupled to and separating the first electrode from the second electrode and the magnetic tunnel junction comprises a free magnetic layer having a magnetization orientation that is switchable between a high resistance state magnetization orientation and a low resistance state magnetization orientation, and the magnetic field switches the free magnetic layer magnetization orientation between a high resistance state magnetization orientation and a low resistance state magnetization orientation, and the high resistance state magnetization orientation and a low resistance state magnetization orientation forms an angle with the current path in a range from 10 to 80 degrees; and
the permalloy layer separates the first electrode from the free magnetic layer;
wherein the magnetic memory does not pass a write current through the second electrode and generates the magnetic field solely by the write current passing along the first electrode.

18. A magnetic memory device according to claim 17, wherein the free magnetic layer is spaced from the first electrode a distance of less than 10 nanometers.

19. A magnetic memory device according to claim 17, wherein the write current path defines a first horizontal plane and the free layer magnetization orientation defines a second horizontal plane, and the first horizontal plane is parallel to the second horizontal plane.

* * * * *